(12) United States Patent
Sato

(10) Patent No.: US 6,480,430 B2
(45) Date of Patent: Nov. 12, 2002

(54) SEMICONDUCTOR DEVICE MAKING RELIABLE INITIAL SETTING

(75) Inventor: Takahiko Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/929,041

(22) Filed: Aug. 15, 2001

(65) Prior Publication Data

US 2002/0054521 A1 May 9, 2002

(30) Foreign Application Priority Data

Nov. 6, 2000 (JP) ....................................... 2000-338058

(51) Int. Cl.[7] ................................................. G11C 7/00
(52) U.S. Cl. ..................... 365/200; 365/203; 365/225.7
(58) Field of Search ............................ 365/200, 225.7, 365/203

(56) References Cited

U.S. PATENT DOCUMENTS 6,201,733 B1 * 3/2001 Hiraki et al. .......... 365/185.08
6,269,051 B1 * 7/2001 Funaba et al. ................ 331/51
6,411,169 B1 * 6/2002 Yabe et al. ............ 331/116 FE

* cited by examiner

Primary Examiner—Richard Elms
Assistant Examiner—Hien Nguyen
(74) Attorney, Agent, or Firm—Arent Fox Kintner Plotkin & Kahn, PLLC

(57) ABSTRACT

A semiconductor device includes a fuse circuit which stores information represented by fuse connections, a power-on circuit which generates a power-on signal that changes a signal level thereof following power-on of the device, a timing circuit which starts timing a predetermined duration upon the signal level change of the power-on signal, and a control circuit which makes an initial setting by referring to the information of said fuse circuit in response to an event that said timing circuit finishes timing the predetermined duration.

8 Claims, 8 Drawing Sheets

SEMICONDUCTOR DEVICE MAKING RELIABLE INITIAL SETTING

BACKGROUND OF THE INVENTION

1. Field of the Invention

The present invention generally relates to semiconductor devices, and particularly relates to a semiconductor device in which initial settings are made by use of internal fuses or the like.

2. Description of the Related Art

In semiconductor devices such as semiconductor memory devices, fuses of the fuse circuit provided in the devices are selectively disconnected to make settings with respect to address redundancy, input/output interface configurations, refresh cycles, etc., at the time of shipping out from the factory. In order to refer to the fuse information at the time of actual operation, semiconductor devices may employ one of two methods, i.e., either continuously applying electric currents to fuses so as to obtain the fuse information constantly or referring to the fuse information by use of a starter signal (i.e., internal reset signal) generated at the start of device operations and making initial settings to internal circuits based on the obtained fuse information.

The former method has a drawback in that the larger the number of fuses, the greater the electric current consumption. The latter method has an advantage in that the current consumption can be reduced because an electric current does not run through the fuses during actual operations, but has a problem in that timing of an internal reset signal generated at the start of device operations may differ from device to device because of product variation. Due to this product variation, an initial setting operation may be performed on an internal circuit before an internal power supply voltage rises to a sufficient level. In such a case, some transistors of the internal circuit may not receive sufficient power supply voltages, so that resulting settings may be different from the expected initial settings, possibly causing a malfunction.

Accordingly, there is a need for a semiconductor device that can make correct initial settings to internal circuits by referring to fuse information at the start of device operations.

SUMMARY OF THE INVENTION

It is a general object of the present invention to provide a semiconductor device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides a semiconductor device, including a fuse circuit which stores information represented by fuse connections, a power-on circuit which generates a power-on signal that changes a signal level thereof following power-on of the device, a timing circuit which starts a time measurement upon the signal level change of the power-on signal, and a control circuit which makes an initial setting by referring to the information of the fuse circuit in response to a completion of the time measurement for a predetermined duration.

In one embodiment, the timing circuit described above includes an oscillator and a counter. Further, the semiconductor device includes a memory cell array which stores information therein, and a refresh circuit which controls a refresh operation of the memory cell array, wherein the oscillator and the counter are the oscillator and the counter that are used by the refresh circuit to time a refresh cycle.

In the semiconductor device of the present invention as described above, an oscillator starts an operation thereof in response to the power-on signal generated at the time of device power-on, and a predetermined internal is timed based on the oscillating signal of the oscillator. After the passage of the predetermined interval, fuse information is referred to so as to make initial settings to a refresh cycle, redundancy processing, etc. In this manner, the timing at which the fuse information is referred to is not determined from the power-on signal as in the related-art configurations, but is determined by a predetermined interval that is timed by the timing device such as an oscillator. Because of this, even if the timing of the power-on signal generated at the start of device operations differs from device to device due to product variation, the present invention can avoid a troublesome situation in which the initial settings are made before the internal power supply voltage rises to a sufficient level. As a result, the present invention can avoid a malfunction that would otherwise be caused by wrong settings that are different from correct initial settings. Here, the predetermined interval that should pass before the start of an operation referring to the fuse information is such an interval as a stable circuit operation is guaranteed after a sufficient rise of the power supply voltage.

DESCRIPTION OF THE PREFERRED EMBODIMENTS

In the following, embodiments of the present invention will be described with reference to the accompanying drawings.

In the following description, a semiconductor memory device will be used as an example of a semiconductor device. As will be apparent from the description, however, the present invention is not limited to this embodiment, and is applicable to various types of semiconductor devices in general.

Figure 1:
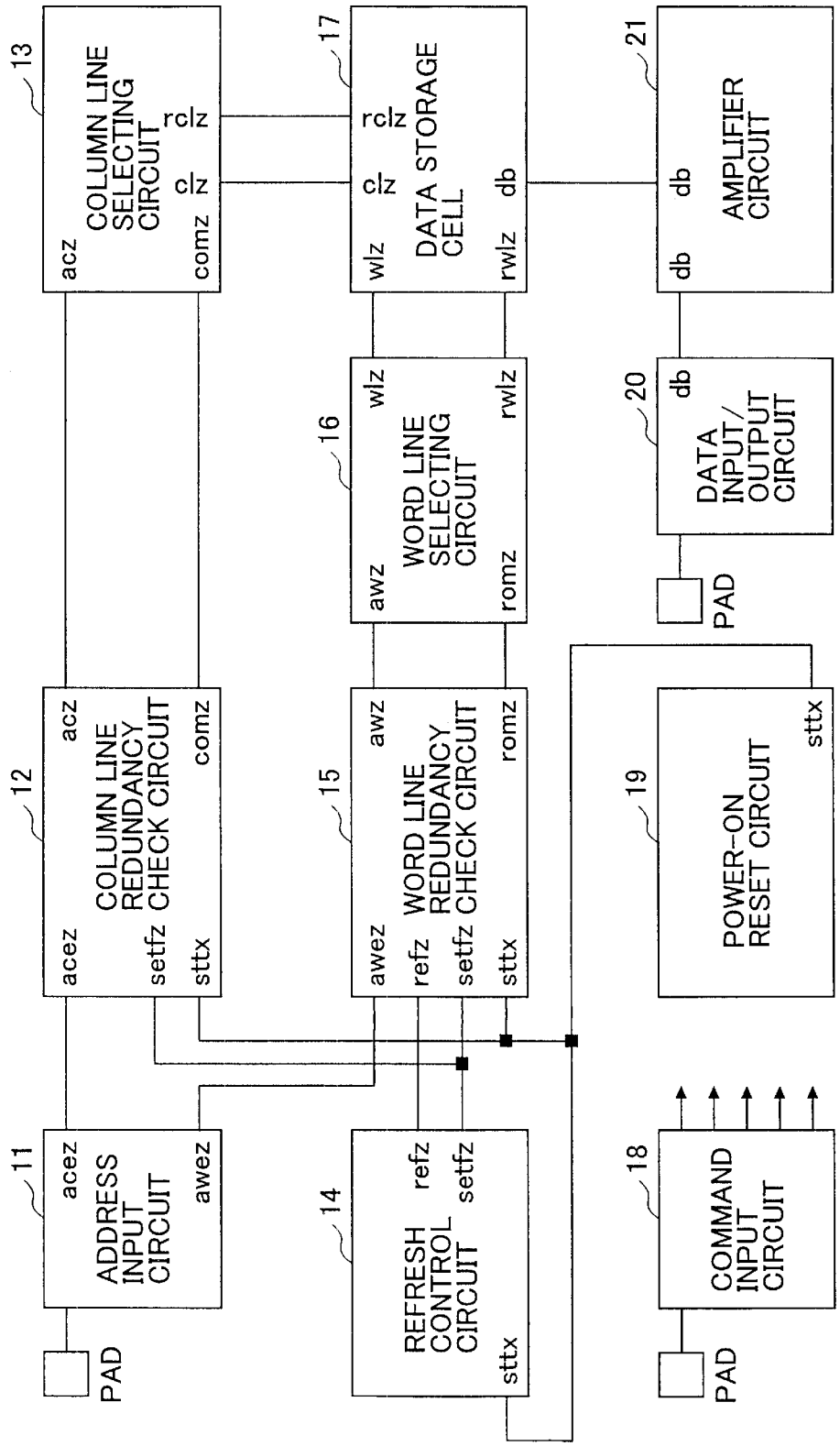
FIG. 1 is a block diagram showing a configuration of a semiconductor memory device to which the present invention is applied.

FIG. 1 is a block diagram showing a configuration of a semiconductor memory device to which the present invention is applied.

The semiconductor memory device 10 of FIG. 1 includes an address input circuit 11, a column line redundancy check circuit 12, a column line selecting circuit 13, a refresh control circuit 14, a word line redundancy check circuit 15, a word line selecting circuit 16, a data storage cell 17, a command input circuit 18, a power-on reset circuit 19, a data input/output circuit 20, and an amplifier circuit 21.

The address input circuit 11 receives address signals provided from an exterior of the device as input signals. The address input circuit 11 supplies a column-line-selection-purpose address acez to the column line redundancy check circuit 12, and also supplies a word-line-selection-purpose address awez to the word line redundancy check circuit 15.

The command input circuit 18 receives command signals supplied from an exterior of the device. The command signals are decoded by a command decoder provided in the command input circuit 18. According to the decoding results, each unit of the semiconductor memory device 10 will be controlled to perform a specified operation. In FIG. 1, details of this control system are omitted.

The power-on reset circuit 19 generates a power-on signal sttx that becomes HIGH when the semiconductor memory device 10 is switched on. The power-on signal sttx is supplied to the refresh control circuit 14, the column line redundancy check circuit 12, and the word line redundancy check circuit 15.

In response to the power-on signal sttx supplied from the power-on reset circuit 19, the refresh control circuit 14 starts an operation thereof to time a predetermined interval based on an oscillating signal of its internal oscillator. After the passage of this predetermined interval, the refresh control circuit 14 makes a setting to a refresh cycle based on the internal fuse information. Further, after the passage of this interval, the refresh control circuit 14 supplies an operation mode setting signal setfz to the column line redundancy check circuit 12 and to the word line redundancy check circuit 15. During a normal and routine operation after the device setup, the refresh control circuit 14 times the refresh cycle set as described above based on the oscillating signal of its internal oscillator, and generates a refresh instructing signal refz at the intervals equal to the refresh cycle. This signal refz is supplied to the word line redundancy check circuit 15. In response to the refresh instructing signal refz, a refresh operation is performed on the data storage cell 17.

The column line redundancy check circuit 12 operates in response to the power-on signal sttx from the power-on reset circuit 19 and the operation mode setting signal setfz from the refresh control circuit 14, and makes initial settings with respect to column redundancy by referring to the internal fuse information. Further, the column line redundancy check circuit 12 receives the column-line-selection-purpose address acez from the address input circuit 11, and supplies a non-redundancy-column-line selecting address acz to the column line selecting circuit 13 in the case of non-redundancy. In the case of redundancy, the column line redundancy check circuit 12 supplies a redundancy-column-line selecting address comz to the column line selecting circuit 13. Based on the column-line selecting address supplied thereto, the column line selecting circuit 13 selectively activates a non-redundancy column line clz or a redundancy column line rclz.

The word line redundancy check circuit 15 is responsive to the power-on signal sttx from the power-on reset circuit 19 and the operation mode setting signal setfz from the refresh control circuit 14, and refers to the internal fuse information to make initial settings to the word redundancy. Further, the word line redundancy check circuit 15 receives the word-line-selection-purpose address awez from the address input circuit 11, and supplies a non-redundancy-word-line selecting address awz to the word line selecting circuit 16 in the case of non-redundancy. In the case of redundancy, the word line redundancy check circuit 15 supplies a redundancy-word-line selecting address romz to the word line selecting circuit 16. Based on the word-line selecting address supplied thereto, the word line selecting circuit 16 selectively activates a non-redundancy word line wlz or a redundancy word line rwlz.

The data storage cell 17 connects memory cells of a given word line to bit lines when this word line is selectively activated in accordance with an indicated word address, and amplifies the data of the bit lines by using sense amplifiers. When a column line corresponding to an indicated column address is selectively activated, the bit lines corresponding to this column line are connected to a data bus db. At the time of data-read operations, read data is amplified by the amplifier circuit 21, and is then supplied to the exterior of the semiconductor memory device 10 from the data input/output circuit 20. At the time of data-write operations, data to be written is supplied from the exterior of the semiconductor memory device 10 to the data storage cell 17 via the data input/output circuit 20 and the amplifier circuit 21, and is stored in a memory cell corresponding to an indicated column address and an indicated word address.

In the semiconductor memory device of the present invention as described above, an oscillator starts an operation thereof in response to the power-on signal generated at the time of device power-on, and a predetermined internal is timed based on the oscillating signal of the oscillator. After the passage of the predetermined interval, fuse information is referred to so as to make initial settings to the refresh cycle and the redundancy processing. In this manner, the timing at which the fuse information is referred to is not determined from the power-on signal as in the related-art configurations, but is determined by the operation mode setting signal generated at a predetermined time that is timed by a time measurement device such as an oscillator. Because of this, even if the timing of the power-on signal generated at the start of device operations differs from device to device due to product variation, the present invention can avoid the troublesome situation in which the initial settings are made before the internal power supply voltage rises to a sufficient level. As a result, the present invention can avoid a malfunction that would otherwise be caused by wrong settings that are different from correct initial settings. Here, the predetermined interval that should pass before the start of an operation referring to the fuse information is such an interval as a stable circuit operation is guaranteed after a sufficient rise of the power supply voltage.

Figure 2:
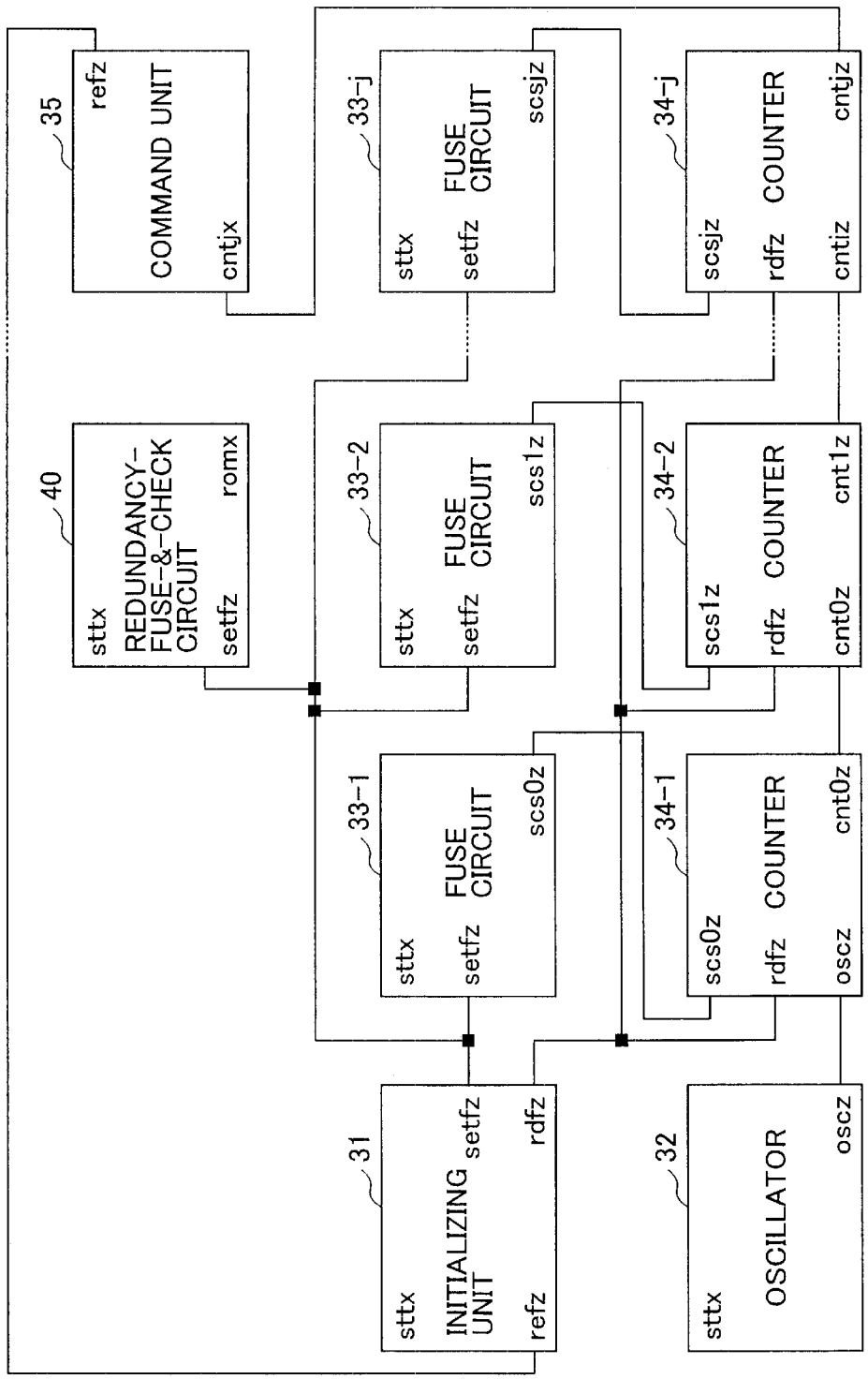
FIG. 2 is a block diagram showing a configuration of a refresh control circuit and a portion of a word line redundancy check circuit.

FIG. 2 is a block diagram showing a configuration of the refresh control circuit 14 and a portion of the word line redundancy check circuit 15.

In FIG. 2, the refresh control circuit 14 includes an initializing unit 31, an oscillator 32, fuse circuits 33-1 through 33-j, counters 34-1 through 34-j, and a command unit 35. A redundancy-fuse-&-check circuit 40 shown in FIG. 2 shows a portion of the word line redundancy check circuit 15 relevant to a redundancy check, and receives the operation mode setting signal setfz from the initializing unit 31 of the refresh control circuit 14.

Figure 3:
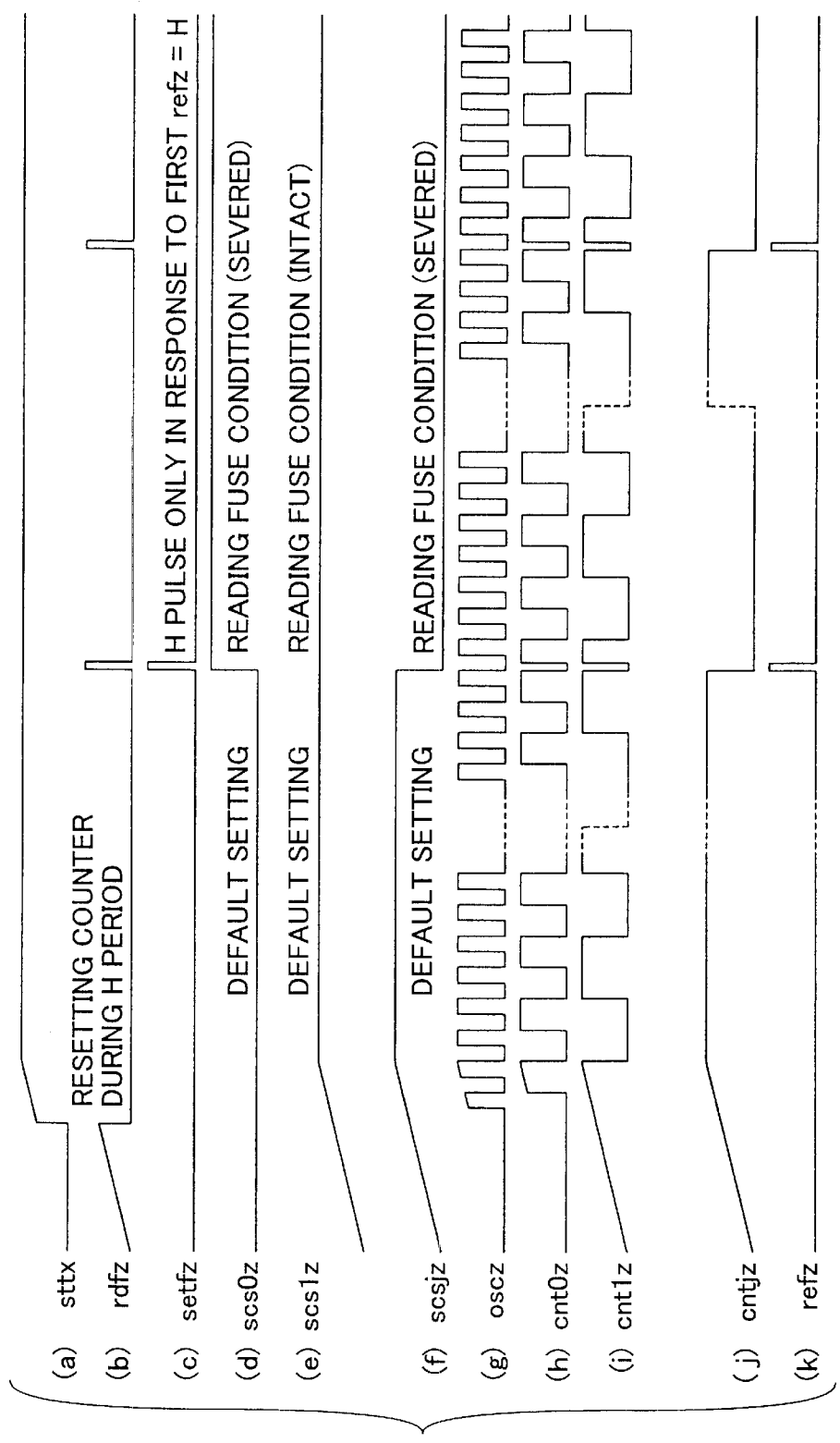
FIG. 3 is a signal waveform drawing for explaining operations of the refresh control circuit shown in FIG. 2.

FIG. 3 is a signal waveform drawing for explaining operations of the refresh control circuit 14 shown in FIG. 2. The operations of the refresh control circuit 14 will be described below with reference to FIG. 2 and FIG. 3.

As a start, the power-on signal sttx generated by the power-on reset circuit 19 is supplied to the initializing unit 31, the oscillator 32, and the fuse circuits 33-1 through 33-j. As shown as a letter designation (a) in FIG. 3, the power-on signal sttx appears when an internal voltage rises and reaches a predetermined voltage level at the time of power-on, and maintains a HIGH level thereof thereafter. Here, the way the internal voltage rises at the time of power-on can be observed by referring to rises of a signal scslz (FIG. 3, (e)) and a signal scsjz (FIG. 3, (f)), for example.

In response to the power-on signal sttx, the oscillator 32 starts oscillating to generate a predetermined oscillating signal oscz as shown as a letter designation (g) in FIG. 3. The oscillating signal oscz is supplied to the counter 34-1. Each of the counters 34-1 thorugh 34-j is a binary counter, and serves as a ½ frequency divider to divide an input frequency by half. The counter 34-1 that receives the oscillating signal oscz of the oscillator 32 outputs a ½ frequency divided signal cntoz (FIG. 3, (h)). The counter 34-2 that receives the ½ frequency divided signal cntoz outputs a ¼ frequency divided signal cntlz (FIG. 3, (i)). By the same token, the counter 34-j outputs a $½^j$ frequency divided signal cntjz (FIG. 3, (j)).

The signal cntjz output from the counter 34-j is supplied to the command unit 35. The command unit 35 is responsive to a falling edge of the signal cntjz to generate pulse signal refz (FIG. 3, (k): the same signal as the refresh instructing signal refz described in connection with FIG. 1). The pulse signal refz becomes HIGH at the end of each refresh cycle. The pulse signal refz is supplied from the command unit 35 to the initializing unit 31.

The initializing unit 31 responds to the pulse signal refz to generate the operation mode setting signal setfz. The pulse signal refz is generated at the time of initial setting in response to a falling edge of the signal cntjz, and is thereafter generated at each interval equal to the refresh cycle. On the other hand, the operation mode setting signal setfz is generated only in response to the first one of the pulse signal refz. Accordingly, the operation mode setting signal setfz becomes HIGH only once a predetermined time after the start of a device operation, as shown as a letter designation (c) in FIG. 3. The initializing unit 31 obtains an OR logic of the pulse signal refz and a signal corresponding to an inverse of the power-on signal sttx, thereby generating a counter reset signal rdfz (FIG. 3, (b)) that rises toward HIGH at the start of power-on and becomes HIGH at the timing of the pulse signal refz being HIGH. The counter reset signal rdfz resets all the counters 34-1 through 34-j at the start of power-on and at an end of each refresh cycle, so that the counters 34-1 through 34-j are given settings according to the fuse circuits 33-1 through 33-j.

The fuse circuits 33-1 through 33-j receives the operation mode setting signal setfz from the initializing unit 31, and generates counter reset signals scsoz through scsjz (FIG. 3, (d) through (f)) according to internal fuse connections. If a counter reset signal is LOW, a corresponding counter is reset to provide a LOW output. If a counter reset signal is HIGH, a corresponding counter is reset to provide a HIGH output.

In the semiconductor memory device of the present invention described above, an oscillator starts an operation thereof in response to the power-on signal generated at the time of device power-on, and a predetermined internal is timed based on the oscillating signal of the oscillator. After the passage of the predetermined interval, fuse information is referred to so as to make initial settings to the refresh cycle. Namely, when the fuse circuits 33-1 through 33-j receive the operation mode setting signal setfz from the initializing unit 31, the fuse circuits 33-1 through 33-j provide the respective counter reset signals scs0z through scsjz according to the internal fuse connections. Through the provision of these signals, the initial states of the counters 34-1 through 34-j upon resetting are controlled according to the fuse connections. This makes it possible to set the refresh cycle to a predetermined interval according to the fuse conditions.

As shown in FIG. 2, further, the operation mode setting signal setfz is supplied to the redundancy-fuse-&-check circuit 40. The redundancy-fuse-&-check circuit 40 makes initial settings to the redundancy processing in accordance with internal fuse connections.

In the following, a detailed circuit configuration of each unit shown in FIG. 2 will be described.

Figure 4:
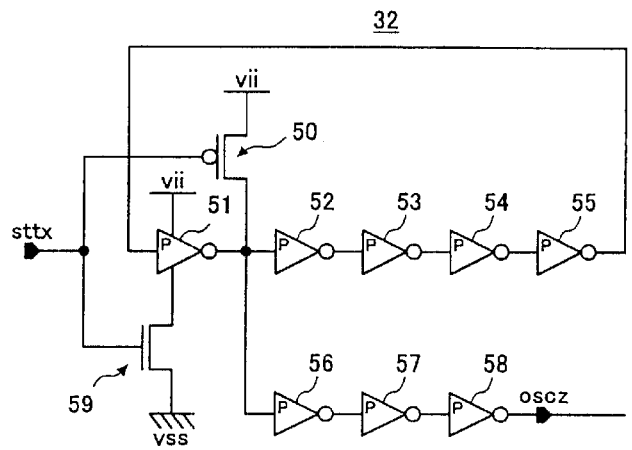
FIG. 4 is a circuit diagram showing a circuit structure of an oscillator.

FIG. 4 is a circuit diagram showing a circuit structure of the oscillator 32.

The oscillator 32 includes a PMOS transistor 50, a gated inverter 51, inverters 52 through 58, and an NMOS transistor 59. As the power-on signal sttx becomes HIGH, the gated inverter 51 opens the gate thereof, whereby the inverters 51 through 55 together make up a ring oscillator, and start oscillating. The oscillating signal oscz is supplied to the counter 34-1.

Figure 5:
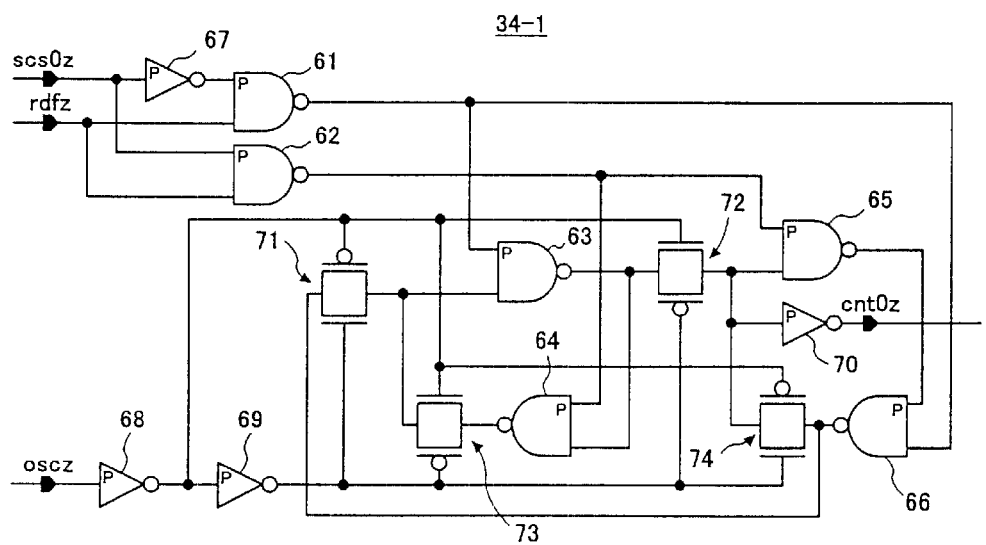
FIG. 5 is a circuit diagram showing a circuit configuration of a counter.

FIG. 5 is a circuit diagram showing a circuit configuration of the counter 34-1. Each of the counters 34-1 through 34-j has a circuit structure as shown in FIG. 5.

The counter includes NAND circuits 61 thorugh 66, inverters 67 through 70, and transfer gates 71 through 74. Each of the transfer gates 71 through 74 is comprised of a PMOS transistor and an NMOS transistor connected in parallel.

During a time period when the counter operates, the counter reset signal rdfz is LOW, so that the NAND circuits 61 and 62 provide HIGH outputs. As a result, the NAND circuits 63 through 66 have one input thereof fixed to HIGH, thereby serving as an inverter to the other input thereof. The NAND circuits 63 and 64 together form a first latch, and the NAND circuits 65 and 66 together form a second latch. Between these two latches, the transfer gates 71 through 74 are opened and closed in synchronization with the oscillating signal oscz, thereby repeating data transfer from one of the latches to the other. When the oscillating signal oscz is HIGH, the data of the second latch is output as the counter output signal cntoz. When the oscillating signal oscz is LOW, on the other hand, the data of the first latch is output as the counter output signal cnt0z.

When the counter output signal cnt0z is changed from the data of the first latch to the data of the second latch, the logic value of this output signal does not change. When the counter output signal cnt0z is changed from the data of the second latch to the data of the first latch, the logic value of this output signal changes from HIGH to LOW or from LOW to HIGH.

Through the operations described above, the counter output signal cnt0z is obtained as a ½ frequency divided signal having half a frequency of the oscillating signal oscz. The counters 34-2 through 34-j operate substantially in the same manner, except that they receive as an input signal thereto the output of a counter situated at the preceding stage, rather than receive the oscillating signal oscz.

Figure 6:
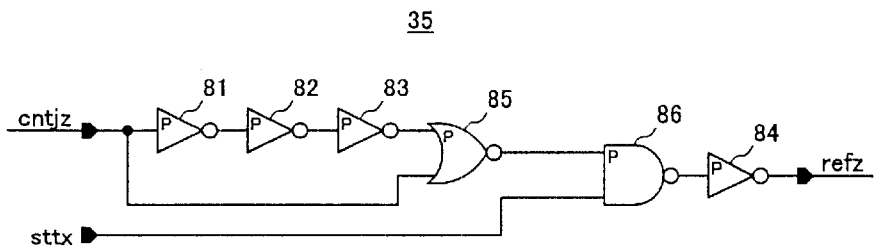
FIG. 6 is a circuit diagram showing a circuit configuration of a command unit.

FIG. 6 is a circuit diagram showing a circuit configuration of the command unit 35.

The command unit 35 of FIG. 6 includes inverters 81 through 84, a NOR circuit 85, and a NAND circuit 86.

When the signal cntjz output from the counter 34-j drops to LOW, the output of the NOR circuit 85 becomes HIGH. At an end of a fixed delay time, the falling edge of the signal cntjz having propagated through the inverters 81 through 83 is supplied to the NOR circuit 85 as a rising edge signal. This results in the output of the NOR circuit 85 being changed to LOW. As a result, the output of the NOR circuit 85 ends up forming a pulse signal that maintains its HIGH level during a predetermined time period starting from the falling edge of the signal cntjz output from the counter 34-j. This pulse signal is output as a pulse signal (refresh instructing signal) refz through the NAND circuit 86 and the inverter 84 when the power-on signal sttx is HIGH.

The pulse signal refz is supplied to the initializing unit 31.

Figure 7:
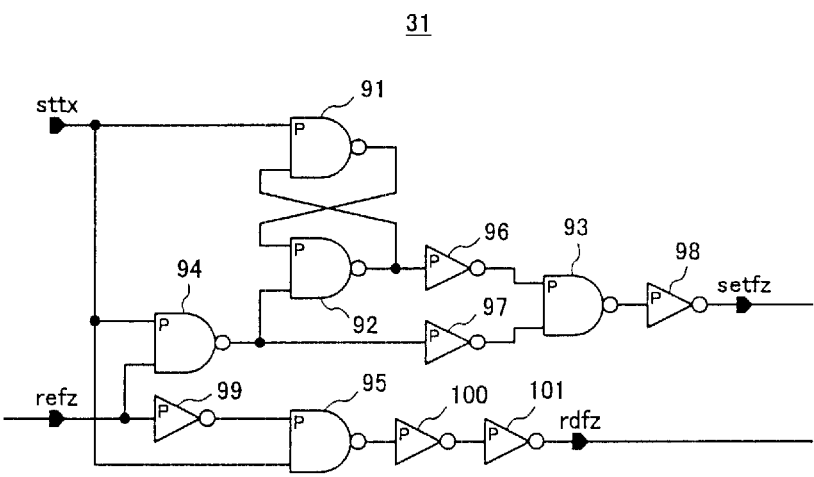
FIG. 7 is a circuit diagram showing a circuit configuration of an initializing unit.

FIG. 7 is a circuit diagram showing a circuit configuration of the initializing unit 31.

The initializing unit 31 of FIG. 7 includes NAND circuits 91 through 95 and inverters 96 through 101.

The NAND circuit 94 and the inverter 97 obtain an AND logic of the power-on signal sttx and the pulse signal refz. Only when both of these signals are HIGH, does the output of the inverter 97 become HIGH, which is supplied to one input of the NAND circuit 93. When this happens, if the output of the inverter 96 supplied to the other input of the NAND circuit 93 is HIGH, the HIGH output of the inverter 97 is output as the operation mode setting signal setfz.

What controls the output of the inverter 96 is the data stored in the latch comprised of the NAND circuits 91 and 92. At the initial state following the power-on, the initial LOW state of the power-on signal sttx causes the outputs of the NAND circuits 91 and 92 to be HIGH and LOW, respectively. These levels are maintained even after the power-on signal sttx becomes HIGH. As a result, the output of the inverter 96 stays HIGH. If the pulse signal refz becomes HIGH in this case, the output of the inverter 97 becomes HIGH, and this HIGH signal is output as the operation mode setting signal setfz. When this happens, the output of the NAND circuit 94 turns LOW, which reverses the latch condition. As a result, the output of the NAND circuit 92 becomes HIGH, which will be maintained thereafter. Accordingly, the output of the inverter 96 stays LOW after this, so that the operation mode setting signal setfz will not be output even when the pulse signal refz is changed to HIGH.

In this manner, the operation mode setting signal setfz is a signal that becomes HIGH only in response to the first pulse of the pulse signal refz.

The inverter 99 through 101 and the NAND circuit 95 obtain an OR logic of an inverse of the power-on signal sttx and the pulse signal refz, thereby outputting the counter reset signal rdfz. Accordingly, when the power-on signal sttx is fixed to the HIGH level, the pulse signal refz is output as it is.

The operation mode setting signal setfz is supplied to each of the fuse circuits 33-1 through 33-j, and the counter reset signal rdfz is supplied to each of the counters 34-1 through 34-j.

Figure 8:
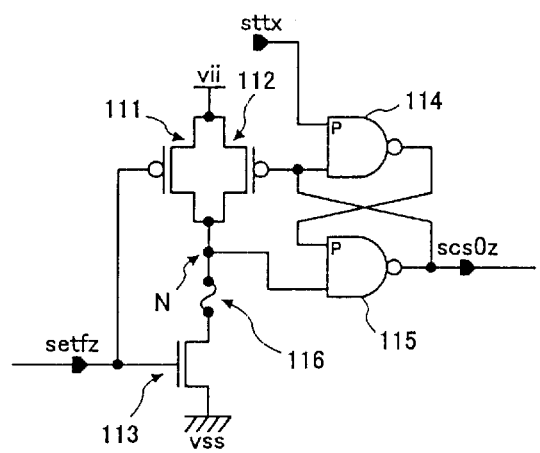
FIG. 8 is a circuit diagram showing a circuit configuration of a fuse circuit.

FIG. 8 is a circuit diagram showing a circuit configuration of the fuse circuit 33-1.

The fuse circuit 33-1 includes PMOS transistors 111 and 112, an NMOS transistor 113, NAND circuits 114 and 115, and a fuse 116.

Immediately after the power-on, the operation mode setting signal setfz is LOW, so that the NMOS transistor 113 is non-conductive. Regardless of the condition of the fuse 116, therefore, the potential of the node N is HIGH. In response to the initial LOW state of the power-on signal sttx, the output of the NAND circuit 114 becomes HIGH, thereby setting the counter reset signal scs0z to LOW. This condition is latched in the latch comprised of the NAND circuits 114 and 115.

When the operation mode setting signal setfz turns HIGH thereafter, the potential of the node N will depend on the condition of the fuse 116. If the fuse 116 is severed, the potential of the node N remains HIGH, whereby the counter reset signal scs0z is set to LOW (i.e., remains at the LOW level). If the fuse 116 is intact, the potential of the node N becomes LOW, so that the counter reset signal scs0z is changed to HIGH.

The counter reset signal scs0z is supplied to the counter 34-1 as a signal that controls the state of the counter at the time of resetting.

Figure 9:
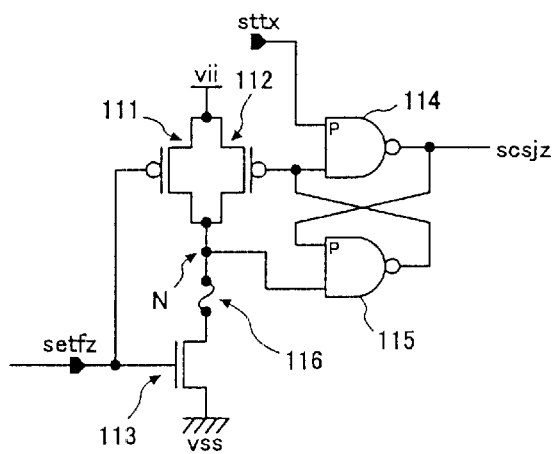
FIG. 9 is a circuit diagram showing a circuit configuration of another fuse circuit.

FIG. 9 is a circuit diagram showing a circuit configuration of the fuse circuit 33-j. The fuse circuits 33-2 through 33-j other than the fuse circuit 33-1 have the circuit configuration of FIG. 9.

The circuit configuration of the fuse circuit 33-j shown in FIG. 9 is substantially identical to that of the fuse circuit 33-1 of FIG. 8, with an only difference being that the output of the NAND circuit 114 is used as the counter reset signal instead of the output of the NAND circuit 115. Because of this configuration, a counter reset signal being HIGH is supplied to a counter during a period immediately after the power-on and before the reading of fuse information. Accordingly, when counters first start operating based on oscillator oscillation after the power-on of the device, the counters 34-2 through 34-j are initialized such that they all provide HIGH outputs.

Once the counter reset signals are given settings based on the fuse information, the counter conditions upon resetting differ depending on the fuse settings. In this manner, the fuse connections are referred to at the timing indicated by the oscillator so as to make initial settings to the counters, thereby controlling the refresh cycle to be a desired period.

Figure 10:
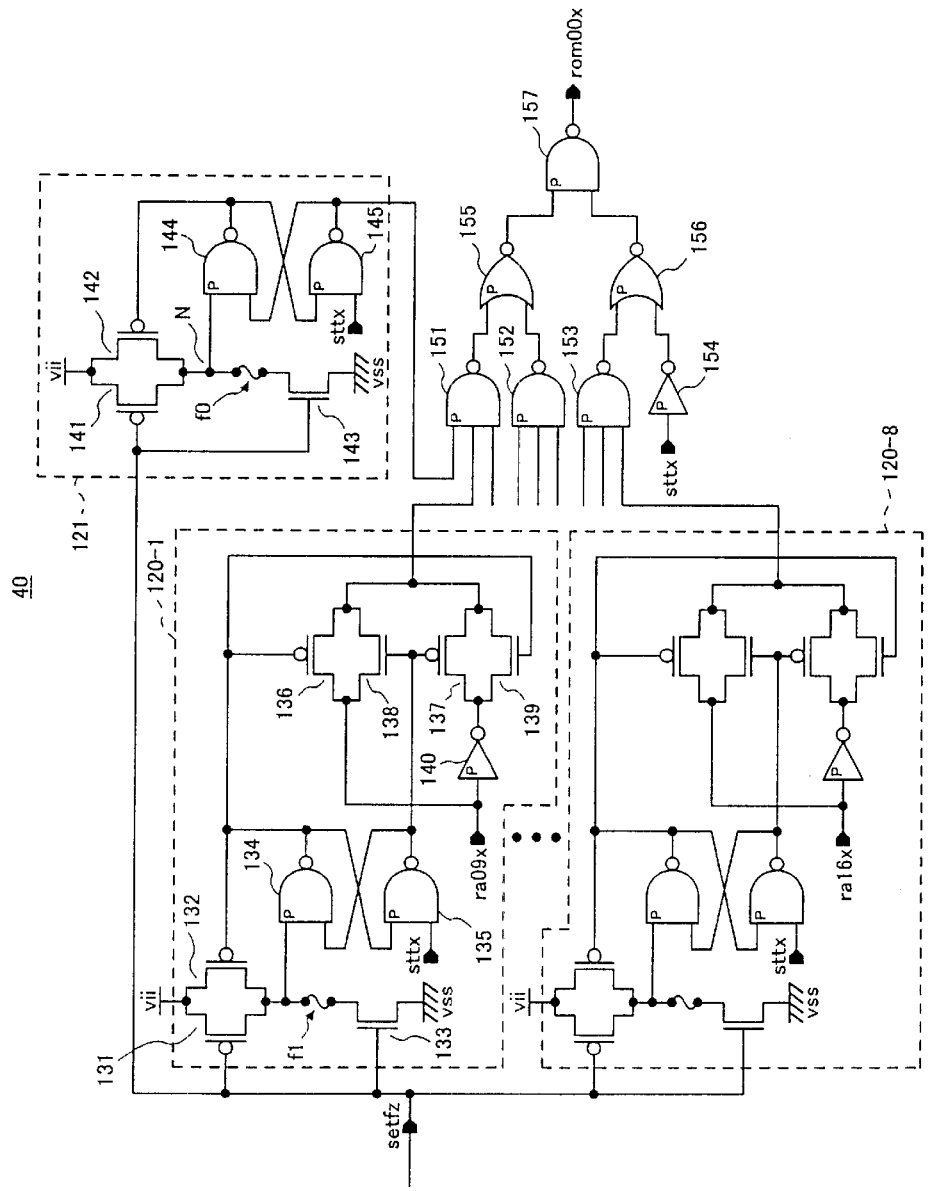
FIG. 10 is a circuit diagram showing a circuit configuration of a redundancy-fuse-&-check circuit.

FIG. 10 is a circuit diagram showing a circuit configuration of the redundancy-fuse-&-check circuit 40.

The redundancy-fuse-&-check circuit 40 of FIG. 10 includes bit fuse circuits 120-1 through 120-8, a redundancy check circuit 121, NAND circuits 151 through 153, an inverter 154, NOR circuits 155 and 156, and a NAND circuit 157.

The bit fuse circuits 120-1 through 120-8 are used to indicate a redundancy address by setting fuse information with respect to each bit of a word address. The bit fuse circuits 120-1 through 120-8 each have the same circuit configuration. The redundancy check circuit 121 is given a setting that indicates whether redundancy processing is applied to a word address indicated by the bit fuse circuits 120-1 through 120-8.

The redundancy check circuit 121 includes PMOS transistors 141 and 142, an NMOS transistor 143, NAND circuits 144 and 145, and a fuse f0.

Immediately after the power-on, the operation mode setting signal setfz is LOW, so that the NMOS transistor 143 is non-conductive. Regardless of the condition of the fuse f0, therefore, the potential of the node N is HIGH. In response to the initial LOW state of the power-on signal sttx, the output of the NAND circuit 145 becomes HIGH, and this condition is latched in the latch comprised of the NAND circuits 144 and 145 even after the power-on signal sttx becomes HIGH. As a result, the redundancy check circuit 121 outputs a HIGH signal.

When the operation mode setting signal setfz turns HIGH thereafter, the potential of the node N will depend on the condition of the fuse f0. If the fuse f0 is disconnected, the potential of the node N remains HIGH, whereby the output of the redundancy check circuit 121 is set to HIGH (i.e., remains at the HIGH level). If the fuse f0 is intact, the potential of the node N becomes LOW, so that the output of the redundancy check circuit 121 is changed to LOW.

When redundancy processing needs to be performed on the word address indicated by the bit fuse circuits 120-1 through 120-8, the fuse f0 of the redundancy check circuit 121 is severed so as to supply the HIGH output to the NAND circuit 151.

Since the bit fuse circuits 120-1 through 120-8 are all the same in terms of their configuration, the bit fuse circuit 120-1 will be described below.

The bit fuse circuit 120-1 includes PMOS transistors 131 and 132, an NMOS transistor 133, NAND circuits 134 and 135, a fuse f1, PMOS transistors 136 and 137, NMOS transistors 138 and 139, and an inverter 140. A circuit portion comprised of the PMOS transistors 131 and 132, the NMOS transistor 133, the NAND circuits 134 and 135, and the fuse f1 is identical to the configuration of the redundancy check circuit 121, and a description thereof will be omitted.

Where the fuse f1 is disconnected, the outputs of the NAND circuits 134 and 135 are LOW and HIGH, respectively. In this case, an address signal ra09x is output from the bit fuse circuit 120-1 via a transfer gate that is comprised of the PMOS transistor 136 and the NMOS transistor 138. Where the fuse f1 is intact, the outputs of the NAND circuits 134 and 135 are HIGH and LOW, respectively. In this case, an inverse of the address signal ra09x is output from the bit fuse circuit 120-1 via a transfer gate that is comprised of the PMOS transistor 137 and the NMOS transistor 139

Accordingly, the fuse f1 is left intact to select the condition in which the address bit is zero, and is severed to select the condition in which the address bit is one. This fuse treatment insures that the output of the bit fuse circuit 120-1 is always HIGH.

The remaining bit fuse circuits have the same configuration and operate in the same manner.

As is understood from the above description, if the fuse f0 is disconnected in the redundancy check circuit 121, and an address is indicated by fuse conditions of the bit fuse circuits 120-1 through 120-8, then, all the inputs to the NAND circuits 151 through 153 become HIGH only when the indicated word address is given as an input. In this case, an output rom00x of the NAND circuit 157 becomes LOW, which initiates an operation that activates a redundancy word line.

In the present invention as described above, a redundancy address is specified by fuse connections, and the information about the fuse connections is referred to at the timing indicated by an oscillator, thereby making initial settings based on the fuse information. This makes it possible to properly control redundancy processing. It should be noted that the configuration of column redundancy is the same as what was described above, and a description thereof will be omitted.

Figure 11:
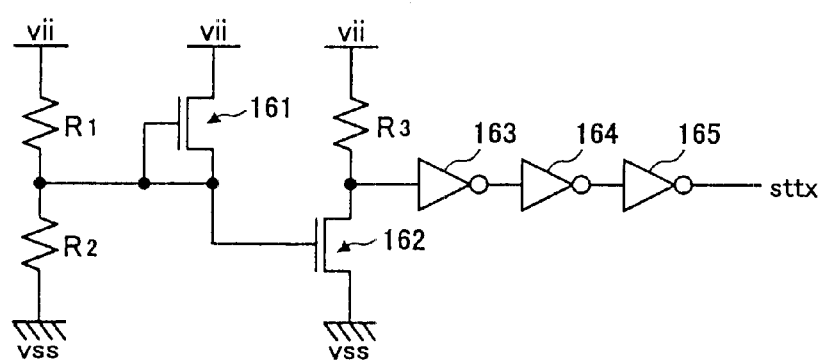
FIG. 11 is a circuit diagram showing an example of a power-on reset circuit.

FIG. 11 is a circuit diagram showing an example of the power-on reset circuit 19.

The power-on reset circuit 19 of FIG. 11 includes resistors Ri through R3, NMOS transistors 161 and 162, and inverters 163 through 165. As an internal power supply voltage Vii gradually increases from 0 V upon the power-on of the device, the divided potential generated by the resistors R1 and R2 exhibits a gradual increase. This divided potential is applied to the gate of the NMOS transistor 162. When the divided potential of the internal power supply voltage Vii reaches a threshold voltage of the NMOS transistor 162, the NMOS transistor 162 become conductive, so that the power-on signal sttx changes from LOW to HIGH. Since the increase of the internal power supply voltage Vii has not yet finished by this time, the power-on signal sttx will have a rise whose waveform reflects the gradual increase of the power supply voltage Vii.

This power-on signal sttx is supplied to the refresh control circuit 14, the column line redundancy check circuit 12, and the word line redundancy check circuit 15 as was described above, thereby controlling setting operations at the time of power-on.

In the description given above, the timing at which the operation mode setting signal setfz is generated is controlled based on the oscillating signal of the oscillator provided inside the refresh control circuit 14. The circuit for controlling the timing, however, is not limited to the oscillator for refresh control, but can be any circuit that can measure time in the semiconductor device. Further, although the embodiment has been provided with reference to a case in which the information specified by fuses relates to the refresh cycle and redundancy processing, this is not intended to be limiting, and the present invention is applicable to a case in which the fuse information is used for selecting an input/output interface configuration, for example. Further, the means by which to provide the setting information is not limited to fuse circuits. For example, the present invention is applicable to a case in which the initial settings of the device are made by referring to information stored in a ROM in advance, for example. Such a variation is intended to fall within the scope of the present invention. A configuration by which information is read from non-fuse-based memory such as a ROM can be easily made based on the description of the embodiment described above, and is intended to be within the scope of the present invention.

Further, the present invention is not limited to these embodiments, but various variations and modifications may be made without departing from the scope of the present invention.

The present application is based on Japanese priority application No. 2000-338058 filed on Nov. 6, 2000, with the Japanese Patent Office, the entire contents of which are hereby incorporated by reference.

What is claimed is:

1. A semiconductor device, comprising:
   a fuse circuit which stores information represented by fuse connections;
   a power-on circuit which generates a power-on signal that changes a signal level thereof following power-on of the device;
   a timing circuit which starts a time measurement upon the signal level change of the power-on signal; and
   a control circuit which makes an initial setting by referring to the information of said fuse circuit in response to a completion of said time measurement for a predetermined duration.

2. The semiconductor device as claimed in claim 1, further comprising:

a memory cell array which stores information therein; and a refresh circuit which controls a refresh operation of said memory cell array, wherein said timing circuit includes an oscillator and a counter that are used by said refresh circuit to time a refresh cycle.

3. The semiconductor device as claimed in claim 2, wherein said control circuit makes the initial setting to the refresh cycle of said refresh circuit by referring to the information of said fuse circuit.

4. The semiconductor device as claimed in claim 1, further comprising a redundancy circuit for processing a redundancy address, wherein said control circuit makes the initial setting to the redundancy circuit by referring to the information of said fuse circuit.

5. The semiconductor device as claimed in claim 1, wherein said control circuit makes the initial setting to an input/output interface configuration by referring to the information of said fuse circuit.

6. A method of making an initial setting in a semiconductor device, comprising the steps of:

generating a signal that changes a signal level thereof following a power-on of the device;

starting timing a predetermined duration upon the signal level change of the signal; and making an initial setting to an internal circuit after passage of the predetermined duration by referring to information stored in advance.

7. The method as claimed in claim 6, wherein said step of making an initial setting to an internal circuit includes a step of making an initial setting to a refresh cycle of memory cells.

8. The method as claimed in claim 6, wherein said step of making an initial setting to an internal circuit includes a step of making an initial setting to redundancy processing.

* * * * *